(12) United States Patent
Heid

(10) Patent No.: US 6,366,090 B1
(45) Date of Patent: Apr. 2, 2002

(54) MAGNETIC RESONANCE TOMOGRAPHY APPARATUS AND OPERATING METHOD ALLOWING MULTIPLE SCANS IN RAPID SUCCESSION

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/473,730

(22) Filed: Dec. 28, 1999

(30) Foreign Application Priority Data

Dec. 28, 1998 (DE) .......................... 198 60 488

(51) Int. Cl.[7] ................................ G01V 3/00
(52) U.S. Cl. ........................ 324/307; 324/309
(58) Field of Search ..................... 324/307, 309

(56) References Cited

U.S. PATENT DOCUMENTS 5,541,514 A 7/1996 Heid et al.

OTHER PUBLICATIONS

"Imaging Systems for Medical Diagnostics," Krestel, Siemens AG, Second Edition, 1990, pp. 544–547.

Primary Examiner—Hezron Williams
Assistant Examiner—Dixomara Vargas
(74) Attorney, Agent, or Firm—Schiff Hardin & Waite

(57) ABSTRACT

In a method in the form of a pulse sequence for operating a magnetic resonance tomography apparatus, and in a magnetic resonance tomography apparatus operated according to the method, image data are obtained according to a SSFP or FISP (Fast Image Steady Precession) pulse sequence. After the end of the imaging sequence, a decay radio-frequency pulse having a flip angle of approximately $\alpha/2$ with a phase angle inverted relative to the last excitation pulse of the imaging sequence is emitted wherein $\alpha$ is the flip angle of the excitation pulses of the imaging sequence. The decay radio-frequency pulse is emitted at an interval $T_R/2$ following the last excitation pulse, where $T_R$ is the repetition time of the imaging sequence.

6 Claims, 2 Drawing Sheets

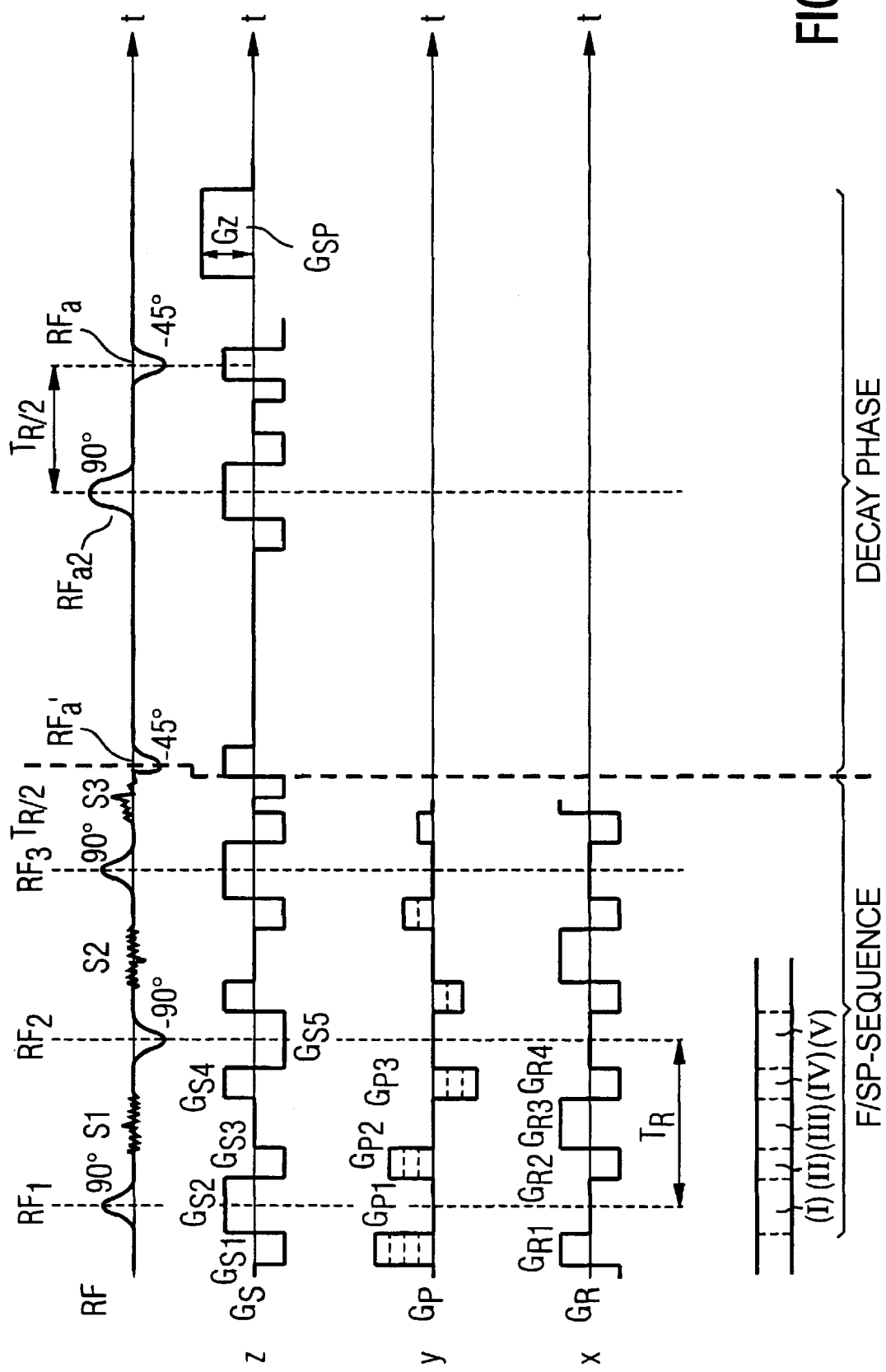

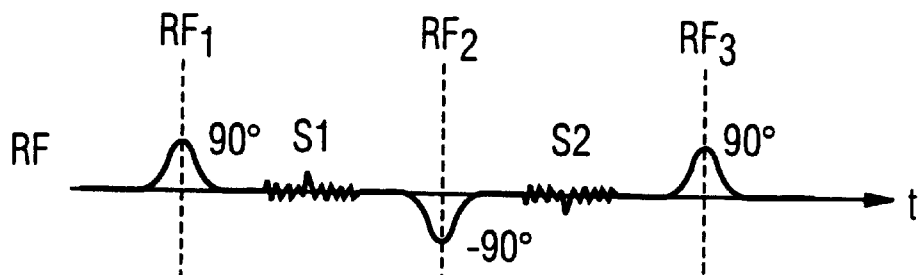
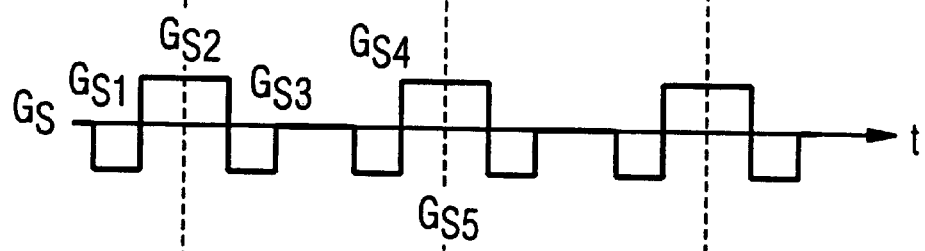
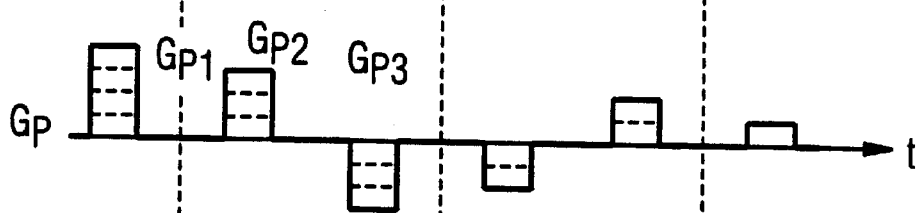
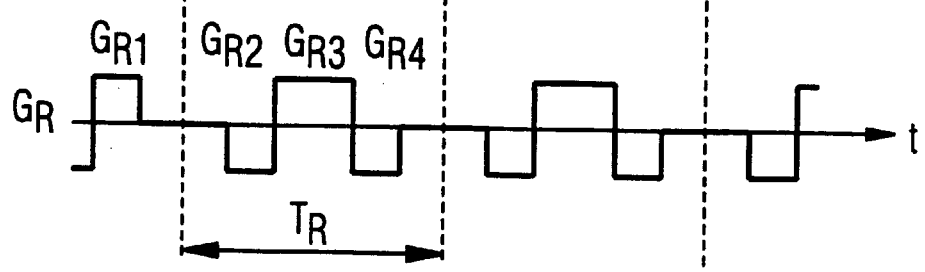

MAGNETIC RESONANCE TOMOGRAPHY APPARATUS AND OPERATING METHOD ALLOWING MULTIPLE SCANS IN RAPID SUCCESSION

BACKGROUND OF THE INVENTION

1. Field of the Invention

The present invention is directed to a pulse sequence for operating a magnetic resonance tomography apparatus as well as to a nuclear magnetic resonance tomography apparatus for implementing the method.

The invention also relates to techniques that employ pulse sequences wherein the magnetization vector in the steady state, given excitation pulses of $\pm\alpha$, oscillates between $+\alpha/2$ and $-\alpha/2$. Examples of such pulse sequences are SSFP and FISP pulse sequences, these being explained below.

2. Description of the Prior Art

German PS 44 27 497 discloses a pulse sequence for a magnetic resonance tomography apparatus. This pulse sequence is based on a pulse sequence usually referred to as "FISP" (Fast Imaging with Steady Precession). The term "FISP" is a known concept in the field of magnetic resonance tomography for a specific pulse sequence and is explained in detail in, for example, E. Krestel, "Imaging Systems for Medical Diagnostics", Siemens AG, Second Edition, 1990, pages 544–547. According to the pulse sequence disclosed by German PS 44 27 497, such a FISP sequence is modified by emitting a radio-frequency pulse in a preparation phase preceding the FISP pulse sequence. This radio-frequency pulse is emitted frequency-selectively and under the influence of a slice selection gradient, so that only one slice of the examination subject is excited. The dephasing caused by the slice selection gradient is in turn canceled by an oppositely directed gradient. The radio-frequency pulse has a flip angle that deflects the magnetization vector, as occurs in the stationary condition of the following pulse sequence. In general, the magnetization vector given excitation pulses of $\pm\alpha$ oscillates between $+\alpha/2$ and $-\alpha/2$, and the radio-frequency pulse must then have a flip angle of $\alpha/2$ with a phase position that is inverted compared to the following radio-frequency excitation pulse.

In the steady state, as stated, the magnetization vector oscillates between $+\alpha/2$ and $-\alpha/2$ given excitation pulses of $\pm\alpha$. The spin magnetization represents a problem with regard to achieving rapid imaging, since it is not yet in the steady state at the start of measurement and leads to signal fluctuations between the echoes, i.e. the raw data lines, which produce image artifacts. The method disclosed in German PS 44 27 497 solves this problem before the beginning of the actual FISP sequence by placing the magnetization vector into condition approximating the steady state by a transient response RF excitation pulse.

Another type of sequence known as an SSFP pulse sequence (Steady State Free Precession) is described, for example from E. Krestel, "Imaging Systems for Medical Diagnostics", Siemens Ag, Second Edition, 1990, pages 544–547, that differs from the FISP sequence essentially in that refocusing gradient pulses are employed in all three directions.

The magnetization which persists following the measurement of, for example, an image data set is left out of consideration in this known technique. If a further image data set is acquired at a short time interval from acquisition of an earlier set, the magnetization that arose from the preceding image data set can appear as a noise signal and cause image artifacts.

German OS 198 18 292 discloses a method for controlling a pulse sequence for a magnetic resonance tomography system and an apparatus for the implementation of the method, which achieves flexibly programmable sequence control.

SUMMARY OF THE INVENTION

It is an object of the present invention to provide a method in the form of a pulse sequence for operating a magnetic resonance tomography apparatus that makes it possible to acquire a further image in a magnetic resonance tomography scan at a brief time interval following acquisition of data for an earlier image.

This object is inventively achieved in a method for operating a magnetic resonance tomography apparatus wherein image data are obtained according to a pulse sequence wherein, in the steady state, the magnetization vector oscillates between $+\alpha/2$ and $-\alpha/2$ given excitation pulses of $\pm\alpha$, and wherein a decay radio-frequency pulse having a flip angle of approximately $\alpha/2$ with a phase position inverted relative to the last excitation pulse is emitted, whereby $\alpha$ is the flip angle of the excitation pulses of the pulse sequence.

The decay radio-frequency pulse is emitted at an interval $T_R/2$ following the last excitation pulse, whereby $T_R$ is the repetition time of the pulse sequence. The term "repetition time" is likewise a known concept in the field of magnetic resonance tomography.

After the end of the pulse sequence and at an interval $T_R/2$ before emitting the decay radio-frequency pulse, a further decay radio-frequency pulse having a flip angle of approximately $\alpha$ and having a phase position inverted relative to the decay radio-frequency pulse can alternatively be emitted, whereby $T_R$ is again the repetition time of the pulse sequence.

In addition to the decay radio-frequency pulse, a gradient pulse having a high product $t \cdot G_z$ can be emitted after the end of the pulse sequence, whereby z is the slice selection direction of the magnetic resonance tomography apparatus and t is the pulse time duration.

According to the present invention, a nuclear magnetic resonance tomography is also provided that has a controller that is programmed for the implementation of the aforementioned steps.

DESCRIPTION OF THE DRAWINGS

FIG. 1 shows the inventive modification of a FISP pulse sequence after the end of the actual FISP pulse sequence.

FIGS. 2 through 5 serve the purpose of explaining a sequence referred to as a TRUE-FISP pulse sequence.

DESCRIPTION OF THE PREFERRED EMBODIMENTS

With reference to FIGS. 2 through 5, a sequence known as a TRUE-FISP (Fast Imaging with Steady Precision) sequence is explained first. Each sub-sequence begins with a radio-frequency excitation pulse $RF_1$ in a time segment 1, this exhibiting a flip angle of 90° in the exemplary embodiment. The radio-frequency pulse $RF_1$ is emitted frequency-selectively and under a slice selection gradient pulse GS2, so that only a selected slice of the examination subject is excited. In a time segment II, a dephasing of the nuclear magnetization ensues in a readout direction with a gradient $G_{R2}$. Further, in time segment II, a phase coding gradient pulse $G_{P2}$ as well as a gradient pulse $GS_3$ directed opposite the slice selection gradient $GS_2$ are emitted. As a result of the gradient pulse $GS_3$, the dephasing caused by the slice selection gradient pulse $GS_2$ is in turn compensated.

In time segment III, a read out gradient pulse $G_{R3}$ is activated, and thus a rephasing of the nuclear spins is achieved, so that a nuclear magnetic resonance signal S1 arises. This magnetic resonance signal S1 is sampled and employed in a conventional way for producing an image.

In a time segment IV, a slice selection gradient pulse $G_{S4}$ in the positive slice selection direction, a gradient pulse $G_{P3}$ opposite the gradient pulse $G_{P2}$ and a gradient pulse $G_{R4}$ in the negative read out direction are activated. In a time segment IV, a slice selection gradient pulse $G_{S4}$ in the positive slice selection direction, a gradient pulse $G_{P3}$ opposite the gradient pulse $G_{P2}$ and a gradient pulse $G_{R4}$ in negative read out direction are activated.

In a time segment V, finally, a radio-frequency pulse $R_{F2}$ having a flip angle of $-90°$ is activated under a slice selection gradient pulse $G_{S5}$ in the negative slice selection direction. A new read out interval is thus initiated. The illustrated pulse sequence is repeated n times with respectively different values of the phase coding gradient pulses $G_{P2}$. The phase position of the radio-frequency excitation pulses is thereby inverted from pulse sequence to pulse sequence, so that the operational sign of the flip angles effected by the excitation pulses RF alternates. The spacing between two radio-frequency excitation pulses RF is referenced $T_R$ (repetition time). All gradients are switched such that their time integral over a repetition time $T_R$ yields zero.

In this method, a fast imaging is possible since the repetition time $T_R$ can be made significantly shorter than the relaxation times T1 and T2.

Given the illustrated pulse sequence, the excursion of the magnetization vector is brought to 90° by the first radio-frequency excitation pulse $RF_1$ and to approximately 0° by the second radio-frequency excitation pulse $RF_2$, so that only every second radio-frequency excitation supplies a signal in a transient response event. A stationary steady state condition is achieved only after a transient response that lies approximately on the order of magnitude of T1 or T2, whereby the flip angle moves between +45° and −45°. Until this steady state has been achieved, the magnetic resonance signal oscillates greatly and cannot be interpreted in practice.

According to the present invention, for example, a SSFP pulse sequence can be employed instead of the FISP pulse sequence, this differing from the FISP sequence essentially in that refocusing gradient pulses are employed in all three directions.

The present invention is generally directed to a technique wherein image data are obtained according to a pulse sequence with which, in the steady state, the magnetization vector oscillates between $+\alpha/2$ and $-\alpha/2$ given excitation pulses of $\pm\alpha$. FISP or SSFP are examples of such pulse sequences.

With reference to FIG. 1, the inventive decay phase following the actual FISP sequence shall now be explained. As can be seen from FIG. 1, a strong gradient pulse $G_{SP}$ (spoiler pulse) is emitted after the actual TRUE-FISP sequence, i.e. a gradient pulse having a large product $t \cdot G_z$, wherein the subscript z represents the slice selection direction of the tomography apparatus. As a result of this gradient pulse $G_{SP}$, the transverse components of the magnetization according to the TRUE-FISP sequence are destroyed, i.e. the components in the image slice plane. The z-component of the magnetization disturbed by the preceding measurement, however, remains uninfluenced by the gradient pulse $G_{SP}$ and thus can cause artifacts in a following image acquisition dependent on the slice orientation of the following measurement and, for example, can drastically reduce the signal amplitude.

In order to suppress both the transverse components as well as the z-components of the magnetization that result from the preceding measurement as noise sources, a decay radio-frequency pulse $RF_a$ or $RF_{a'}$ is inventively emitted after the actual measurement.

The actual decay radio-frequency pulse occurs with a full flip angle in a time interval $T_R/2$ following the last radio-frequency excitation pulse. The decay radio-frequency pulse also has approximately half the flip angle $\alpha/2$ of the flip angle of the radio-frequency excitation pulses of the FISP sequence.

There are a number of alternatives. In order to satisfy the condition that the decay radio-frequency pulse is emitted at a time duration $T_R/2$ following the last full radio-frequency excitation pulse $RF_3$, a decay radio-frequency pulse $RF_{a'}$ having a flip angle of $-45°$ can, as shown in FIG. 1, be emitted for that case wherein the last radio-frequency excitation pulse $RF_3$ exhibited a flip angle of $+90°$, the number $RF_{a'}$ being emitted at a time duration $T_R/2$ following this last radio-frequency excitation pulse $RF_3$.

In order to satisfy the condition of the time offset of $T_R/2$ after the last radio-frequency excitation pulse $RF_3$, it can be beneficial to attach a total of two decay radio-frequency pulses following the last-utilized echo S3.

In FIG. 1, this further decay radio-frequency pulse is referenced $RF_{a2}$, this exhibiting the full flip angle $\alpha$, 90° in the illustrated example, and the phase position being inverted compared to the actual decay radio-frequency pulse $RF_a$ that is still to follow. As can clearly be seen in FIG. 1, the spacing between the last radio-frequency excitation pulse and the first decay pulse is equal to $T_r$ and the spacing between the decay pulses is $T_R/2$.

The phase alternation is continued according to the excitation pulse train.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance tomographic image, comprising the steps of:

generating an imaging pulse sequence, having a repetition time $T_R$, having a plurality of excitation pulses of $\pm\alpha$, including a last excitation pulse, which excite nuclear spins in an examination subject and which cause a magnetization vector of said nuclear spins to oscillate between $+\alpha/2$ and $-\alpha/2$, to obtain image data for a first image of said examination subject; and to prepare for an acquisition of a subsequent data set for a second image of said examination subject, generating a decay radio-frequency pulse having a flip angle of approximately $\alpha/2$ and a phase angle which is inverted relative to a phase angle of said last excitation pulse, at an interval of $T_R/2$ following said last excitation pulse.

2. A method as claimed in claim 1 further comprising, at an end of said pulse sequence, generating a gradient pulse in a slice selection direction z having a high product $t \cdot G_z$, wherein t is a duration of said gradient pulse.

3. A method as claimed in claim 1 comprising emitting a further decay radio-frequency pulse having a flip angle of approximately α and a phase angle which is inverted relative to the phase angle of said decay radio-frequency pulse, after said pulse sequence and at an interval $T_R/2$ preceding said decay radio-frequency pulse.

4. A resonance tomography apparatus comprising:
   a scanner operated by a controller to generate an imaging pulse sequence, having a repetition time $T_R$, having a plurality of excitation pulses of ±α, including a last excitation pulse, which excite nuclear spins in an examination subject in said scanner and which causes a magnetization vector of said nuclear spins to oscillate between +α/2 and −α/2, to obtain image data for a first image of said examination subject; and
   said controller, to prepare for an acquisition of a subsequent data set for a second image of said examination subject, generating a decay radio-frequency pulse having a flip angle of approximately α/2 and a phase angle which is inverted relative to a phase angle of said last excitation pulse, at an interval of $T_R/2$ following said last excitation pulse.

5. An apparatus as claimed in claim 4 wherein said controller, at an end of said pulse sequence, generates a gradient pulse in a slice selection direction z having a high product $t \cdot G_z$, wherein t is a duration of said gradient pulse.

6. An apparatus as claimed in claim 4 wherein said controller emits a further decay radio-frequency pulse having a flip angle of approximately α and a phase angle which is inverted relative to the phase angle of said decay radio-frequency pulse, after said pulse sequence and at an interval $T_R/2$ preceding said decay radio-frequency pulse.

* * * * *